United States Patent [19]

Tseng

[11] Patent Number: 5,753,557
[45] Date of Patent: May 19, 1998

[54] BRIDGE-FREE SELF ALIGNED SILICIDE PROCESS

[75] Inventor: Horng-Huei Tseng, Hsinchu, Taiwan

[73] Assignee: Vanguard International Semiconductor Company, Hsin-Chu, Taiwan

[21] Appl. No.: 729,737

[22] Filed: Oct. 7, 1996

[51] Int. Cl.$^6$ .................. H01L 21/283; H01L 21/336
[52] U.S. Cl. .................. 438/303; 438/305; 438/586; 438/651; 438/683
[58] Field of Search .................. 438/233, 299, 438/301, 303, 305, 586, 592, 649, 651, 655, 682, 683, 185, 196, 360; 257/413, 384

[56] References Cited

U.S. PATENT DOCUMENTS

| | | | |
|---|---|---|---|
| 4,786,609 | 11/1988 | Chen | 438/303 |
| 4,818,715 | 4/1989 | Chao | 438/303 |
| 4,885,259 | 12/1989 | Osinski et al. | 438/303 |
| 5,352,631 | 10/1994 | Sitaram et al. | 438/303 |
| 5,447,875 | 9/1995 | Moslehi | 438/303 |
| 5,472,895 | 12/1995 | Park | 438/586 |
| 5,661,052 | 8/1997 | Inoue et al. | 438/303 |
| 5,682,055 | 10/1997 | Huang et al. | 257/408 |

OTHER PUBLICATIONS

"Novel Process For Eliminating Salicide Bridging", IBM Technical Disclosure Bulletin, vol. 30, No. 4, Sep. 1987, pp. 1645–1646.

*Primary Examiner*—T. N. Quach
*Attorney, Agent, or Firm*—George O. Saile; Stephen B. Ackerman; William J. Stoffel

[57] ABSTRACT

A method of forming a transistor having silicide contacts to shallow gate, source and drain regions 18 in a substrate 10 is disclosed. The transistor has an extended sidewall spacer that covers an outer top portion of the gate. The extended sidewall spacers of the invention extend the distance (leakage path) between the gate and the source/drain thereby reducing the leakage current. The transistor is provided having a gate electrode 12,14,16 and spaced lightly doped source and drain regions 18. A key part of the invention is that the gate insulating layer 16 is laterally etched forming a gate cap insulating layer 16A which only covers an inner central portion of the gate 14. Next, a dielectric layer 20 is formed over the lightly doped source and drain regions 18 and the gate electrode 12,14,16A. The dielectric layer 20 is then anisotropically etched forming extended sidewall spacers 20A which cover the outer top portion of the gate 14. Next, the gate cap insulating layer 16A is removed thereby exposing the top of the gate 14. A metal layer 22 is deposited over the lightly doped source and drain regions 18, the sidewall spacers 20A, and the gate 14. The substrate 10 is then heated thereby forming a metal silicide layer 22A on the lightly doped source and drain regions 18 and the gate 14. The metal layer 22A is then removed from the sidewall spacers 20A. The substrate 10 is implanted with impurity ions forming highly doped source and drain regions 26 and forming a doped gate region 27.

20 Claims, 4 Drawing Sheets

BRIDGE-FREE SELF ALIGNED SILICIDE PROCESS

BACKGROUND OF INVENTION

1) Field of the Invention

This invention relates generally to the fabrication of a semiconductor device that employs electrically insulating sidewall spacers to control device characteristics and more particularly a bridge free self aligned silicide process to form shallower gate, source and drain regions.

2) Description of the Prior Art

The self-aligned silicide or salicide process has two important features. The salicide process uses the gate electrode as a mask during ion implantation of the source and drain regions of a field effect transistor (FET). Also, metal silicide contacts are formed to the source/drain and gate regions by a selective silicide process which uses gate dielectric spacers as masks to prevent silicide from forming on the gates.

The self-aligned silicide or salicide process can be described as follows. An insulated-gate field-effect transistor (FET) made from a body of monocrystalline silicon according to state-of-the-art semiconductor processing techniques usually consists of a conductivity doped polycrystalline silicon (polysilicon) gate electrode, a thin gate dielectric lying under the gate electrode, and a pair of source/drain regions formed in the semiconductor body. The source/drain regions are separated from each other by a channel region that lies below the gate dielectric.

The source/drain regions are typically created by ion implantation in which the gate electrode is used as a shield to prevent implantation into the channel. At the end of the implantation, the sides of the gate electrode are in substantial vertical alignment with the inside boundaries of the source/drain regions. However, lateral diffusion of the implanted dopant during subsequent heating steps causes the source/drain regions to partially overlap the gate electrode in the final FET. The overlap causes a decrease in effective channel length and a loss in FET speed.

One technique for controlling the vertical alignment is to form insulating spacers along the sidewalls of the gate electrode before performing the ion implantation to define the source/drain regions. The sidewall spacers then act as a further implantation shield during the source/drain implantation. This increases the initial lateral separation between the source/drain regions, thereby substantially reducing undesirable overlap of the gate electrode to the source/drain regions.

Another difficulty caused by scaling down is the increase in the resistance of diffused layers. This results in increased signal delays along diffused interconnects and degrades circuit performance due to the large source/drain series resistance.

To alleviate the high electric field at the reduced MOSFET channel length, lightly doped drain (LDD) devices have been proposed. In the LDD structure, narrow, self-aligned, N− regions are introduced between the channel and the N+ source/drain regions. The N− regions spreads the high electric field out near the drain junction, allowing the device to be operated at a higher supply voltage with fewer hot-electron problems.

Several processes for fabrication lightly-doped drain field effect transistor (LDDFET) have been proposed. Spacer and overhang techniques are most commonly adopted. The spacer technique involves a reactive-ion etching (RIE) step after forming a silicon dioxide layer by a chemical vapor deposition process (CVD) to form sidewall oxide spacers. Oxide spacers are used to mask the heavy and deep implant of the N+ source/drain regions after the formation of the shallow N− source/drain regions.

In the salicide process, high quality ohmic contacts are formed to the source, drain and gate. This is accomplished by simultaneously coating all relevant surfaces with a layer of refectory metal such as titanium and then heating for a short time, enabling the refectory metal to react with the underlying silicon to form a thin layer of silicide, such as titanium silicide. Unreacted refectory metal is then removed by etching and a second heat treatment is provided to lower the sheet resistance in the source, drain, and gate regions.

The two heat treatments described above usually are performed using a rapid thermal anneal (RTA). In a RTA, the material is brought to a relatively high temperature as quickly as possible, held then for a relatively short time, and then cooled down as quickly as possible. An example of an RTA cycle would be heating at 680° C. for 40 seconds. RTA, as opposed to slower heat treatments, is needed to try to minimize the diffusion of dopants already present in the device into less than optimal locations and/or concentrations. However, especially when the high concentration source and drains are present, RTA heat treatment does diffuse source/drain dopant impurity ions into less favorable locations and concentrations. This slows down the transistors. Additionally, if the RTA temperature is too low, the silicide will end up with too high a sheet resistance.

Other practitioners have tried to improve the process for forming silicide contacts to a transistor. U.S. Pat. No. 4,885,259 (Osinski et al.) forms source and drain regions in a substrate followed by a metal silicide process including an anneal. The anneal can drive in the impurities from the source and drain regions, thus making the source and drain regions deeper. This can slow down the transistor. Also, the gate is not implanted during the source/drain implants thereby increasing the gate contact resistance.

U.S. Pat. No. 4,818,715 (Chao) shows a method of fabricating a LDDFET with self aligned silicide contacts. However, Chao's gate, source and drain regions are implanted and then metal silicide contacts are made. Again, the metal silicide anneal heat process drives in the already present source/drain doped regions thus slowing the transistor.

U.S. Pat. No. 4,786,609 (Chen) teaches a method of forming FET's using gate sidewall spacers. Chen forms source/drain regions while the gate is covered by an implant barrier layer. This process can be improved by increasing the conductivity of the gate and using a salicide process.

SUMMARY OF THE INVENTION

It is an object of the present invention to provide a method for fabricating bridge free (stringer free) self aligned silicide contacts to a transistor, where the transistor has an elongated leakage path (distance) between the gate contact and the source/drain which reduces leakage currents.

It is another object of the present invention to provide a method for forming highly doped source and drain regions after silicide contacts to the source and drain regions have been formed.

It is still another object of the present invention to form a gate polysilicon layer implanted with ions from the source/drain implantation.

To accomplish the above objectives, the present invention provides a method of forming a transistor having silicide contacts to shallower gate, source and drain regions 18 in a substrate 10. The transistor is provided having a gate electrode 12,14,16 and spaced lightly doped source and drain regions 18. The gate electrode 12,14,16 has vertical sidewalls. The gate electrode has a gate oxide layer 12, a gate 14 (polysilicon gate) and a gate insulating layer 16 (oxide).

Using a photoresist masking block 17A, an outer portion of the gate insulating layer 16 is removed forming a gate cap insulating layer 16A. This exposes the outer top portions of the gate 14. Next, a dielectric layer 20 (nitride) is formed over the lightly doped source and drain regions 18 and the gate electrode 12,14,16A including a portion of the gate cap insulating layer 16A. The dielectric layer 20 is then anisotropically etched forming novel extended sidewall spacers 20A covering the sidewalls of the gate and the outer top portions of the gate 14. Next, the gate cap insulating layer 16A is removed thereby exposing a top portion of the gate 14. A metal layer 22 is deposited over the lightly doped source and drain regions 18, the sidewall spacers 20A, and the gate 14. The substrate 10 is then heated thereby forming a metal silicide layer 22A on the lightly doped source and drain regions 18 and the gate 14. The unreacted metal layer 22 is then removed from the extended sidewall spacers 20A. The substrate 10 is then implanted with impurity ions forming highly doped source and drain regions 26, and forming a doped gate region 27.

This invention provides many benefits over conventional processes. A major feature of the invention is the novel extended sidewalls spacers that cover the outer top portions of the gate. The spacer's coverage of the top portions of the gate lengthens the path that the leakage current must take between the gate and the source/drain. The elongated spacers provide a greater distance between the gate and source/drain regions. The greater distance makes shorts (bridging) between the gate and source/drain regions less probable because the stringers (e.g., titanium and polysilicon etch remnants) have a greater distance to span. The longer leakage path decreases leakage currents and improves yields.

The invention forms shallower gate, source and drain regions because the gate, source and drain implant is performed after the silicide anneal. The shallower gate, source and drain regions provide faster transistor device circuits. The invention can be used for NMOS, PMOS and CMOS.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention provides a method of forming bridge free self aligned silicide contacts to a transistor. The present invention will be described in detail with reference to the accompanying drawings. The term "substrate" is meant to include devices formed within a semiconductor wafer, such as doped regions, and the layers overlying the wafer, such as insulation and conductive layer.

Figure 1:
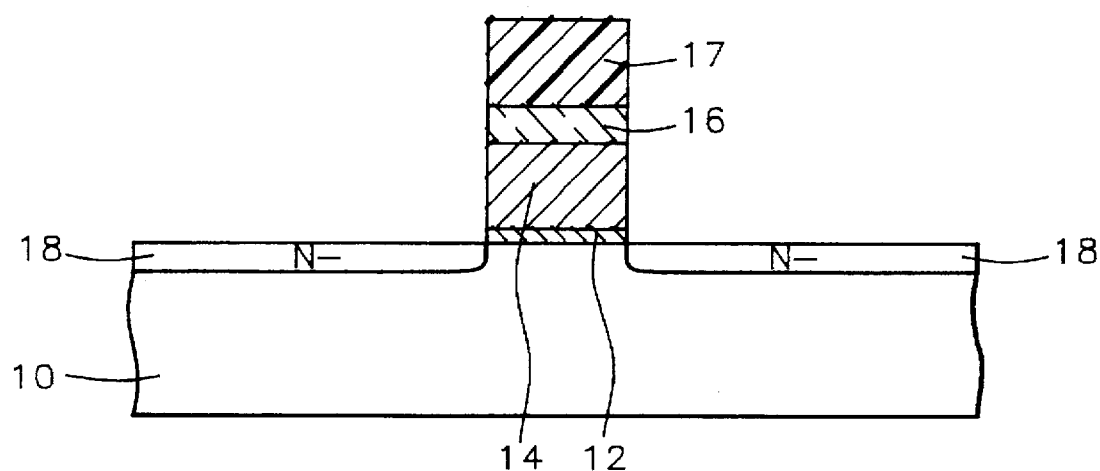
FIGS. 1 through 11 are cross sectional views for illustrating a method for forming bridge free self aligned silicide contacts to a transistor according to present invention.

The invention begins by providing a transistor having a gate electrode 12,14,16 and spaced lightly doped source and drain regions 18. The gate electrode 12,14,16 has vertical sidewalls. The gate electrode is comprised of a gate oxide layer 12, a gate 14 (polysilicon gate) and a gate insulating layer 16 (oxide) as shown in FIG. 1. The gate oxide layer 12 is preferably formed of silicon oxide and preferably has a thickness in the range of between about 80 and 200 Å. The gate 14 is preferably formed of polysilicon. The gate 14 composed of polysilicon can be formed by an in-situ doped low pressure chemical vapor deposition (LPCVD) process. The gate 14 is preferably doped with an N- type impurity with a concentration in the range of between about $1 \times 10^{20}$ and $1 \times 10^{21}$ atoms/cm$^3$. The gate 14 preferably has a thickness in the range of between about 2000 and 4000 Å.

The gate insulating layer 16 is preferably formed of silicon oxide. The gate insulating layer 16 preferably has a thickness in the range of between about 1000 and 2000 Å. The gate insulating layer 16 composed of silicon oxide can be formed by a thermal oxidation process or a CVD process.

Figure 2:
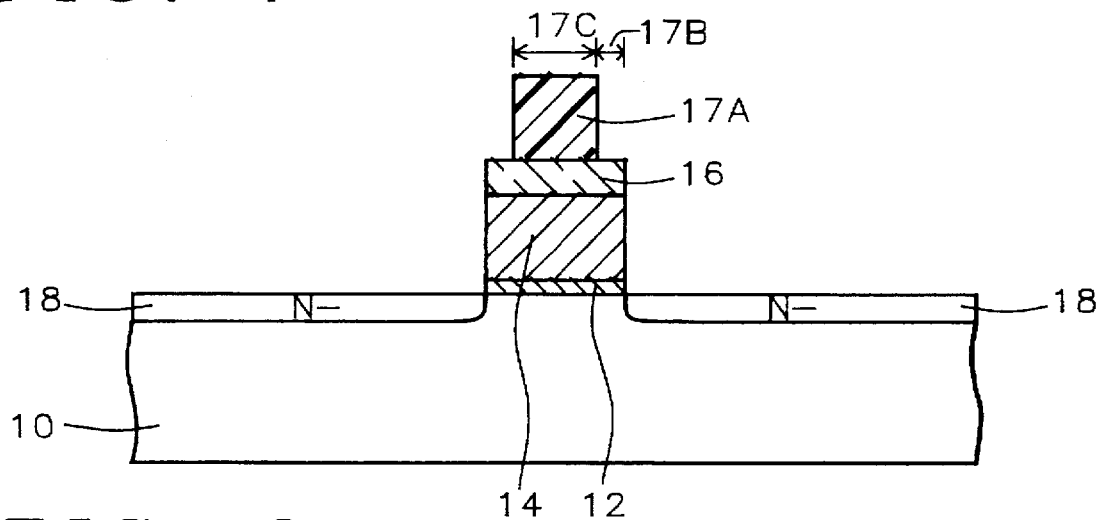

As shown in FIG. 1, a photoresist block 17 is formed over the gate insulating layer 16. Next, as shown in FIG. 2, the photoresist resist layer 17 is laterally etched to form a (photoresist block) masking block 17A. The photoresist layer 17 is laterally etched preferably using an oxygen plasma to form a masking block 17A. The photoresist block 17A preferably has a width 17C in a range of about 0.1 and 0.6 μm.

Figure 3:
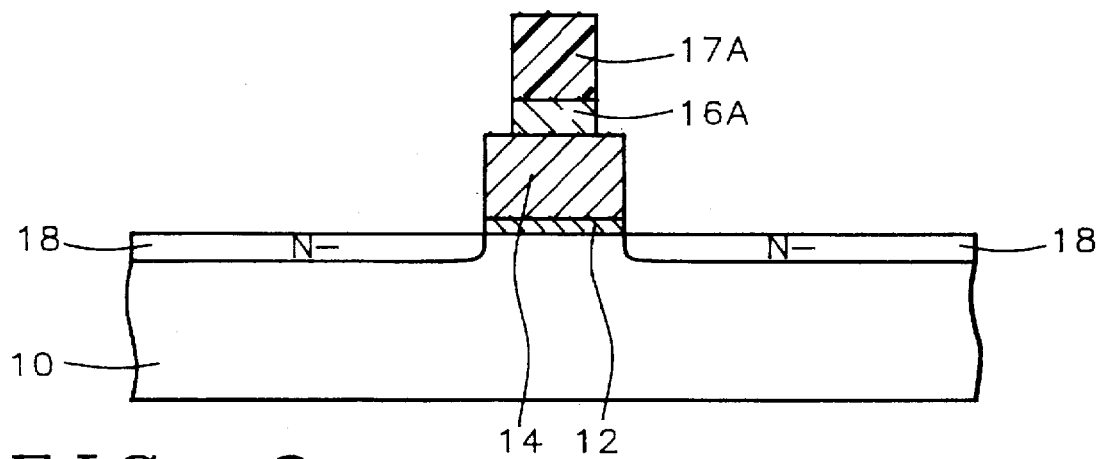
Figure 4:
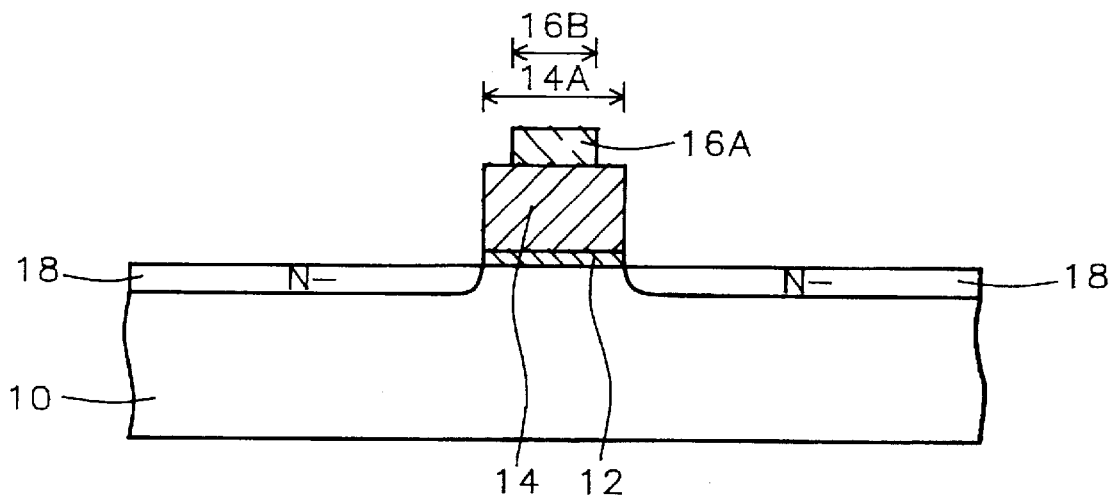

Referring to FIG. 3, the gate insulating layer 16 is etched using the photoresist block 17A as a mask forming a gate cap insulating layer 16A. The etch exposes an outer portion of the gate 14. The photoresist block 17A is then removed as shown in FIG. 4. The gate 14 preferably has a width 14A in a range of about 0.2 and 0.7 μm. The gate cap insulating layer 16A preferably has a width 16B in a range of about 0.1 and 0.6 μm.

The gate cap insulating layer 16A will be used in a subsequent step to form the extended sidewall spacers 20A over the outer portions of the gate electrode 14.

Figure 5:
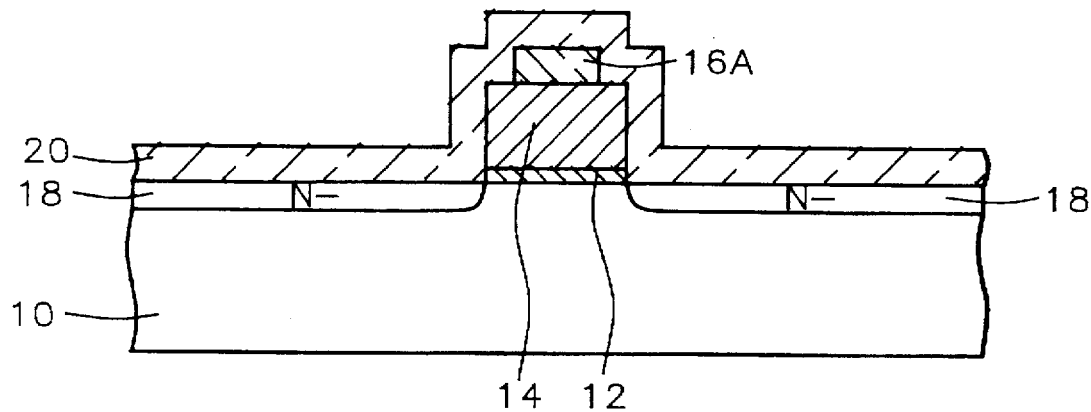

As shown in FIG. 5, a dielectric layer 20 is formed over the lightly doped source and drain regions 18 and the gate electrode 12,14,16A. The dielectric layer 20 is composed of a different material than the gate cap insulating layer 16A. It is important that the dielectric layer and gate cap insulating layer have different etching characteristics. Preferably the dielectric layer is formed of silicon nitride (SiN). The dielectric layer 20 preferably has a thickness in the range of between about 1000 and 2500 Å, and more preferably 2000 Å. A dielectric layer formed of SiN is preferably formed using a low pressure chemical vapor deposition (LPCVD) process. For example, the silicon nitride layer can be formed by reacting silane and ammonia at atmospheric pressure at a temperature of between about 700° to 900° C., or by reacting dichlorosilane and ammonia at reduced pressure at approximately 700° C. Also, silicon nitride can be formed by using a plasma enhanced chemical vapor deposition process by reacting silane with ammonia or nitrogen in a glow discharge at a temperature of between about 200° and 350° C.

Figure 6:
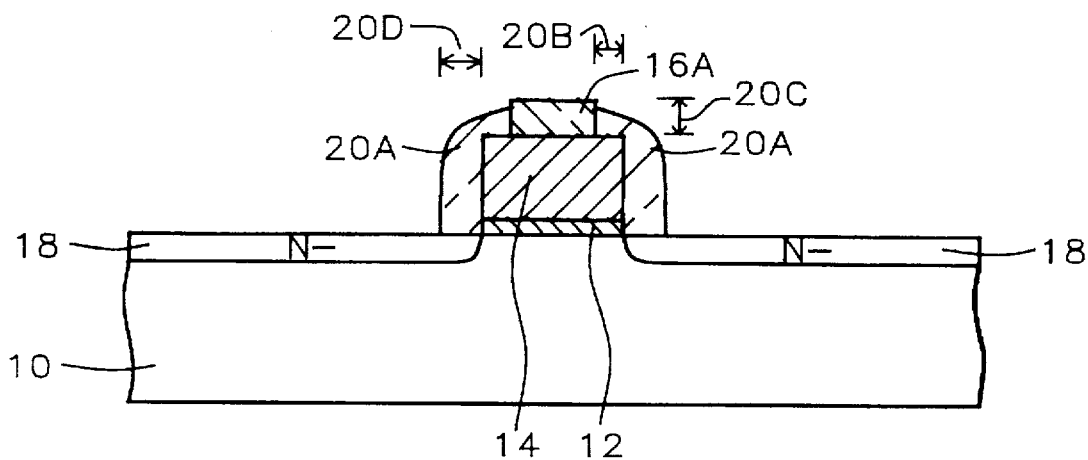

As shown in FIG. 6, "extended" sidewall spacers 20A are formed by anisotropically etching the dielectric layer 20. A key feature of the "extended" sidewall spacers is that they cover a top outer portion of the gate 14. These extended sidewall spacers increase the distance between the source/drain and the gate, which reduces the number of shorts by stringers between the source/drain and the gate. The spacers cover a width 20b of the top of the gate 14 in a range of about 0.05 and 0.1 µm. The anisotropic etch is preferably performed using $CF_4 + O_2$ (+$N_2$), $CF_4 + H_2$, or $CHF_3+Ar$ and more preferably $CHF_3+Ar + O_2$.

The sidewall spacers 20A can be composed of silicon nitride. The sidewall spacers 20A preferably have a height 20C in the range of between about 0.1 and 0.2 µm, and more preferably about 0.15 µm.

Referring to FIG. 6, the sidewall spaces 20A extend above the gate 14 approximately the thickness of the gate cap insulating layer 16A thus helping to prevent bridging (shorting) of the gate and source/drain regions. The sidewall spacers have a width 20D (at the bottom of the gate electrode 12) in the range of between about 1000 and 2500 Å.

Figure 7:
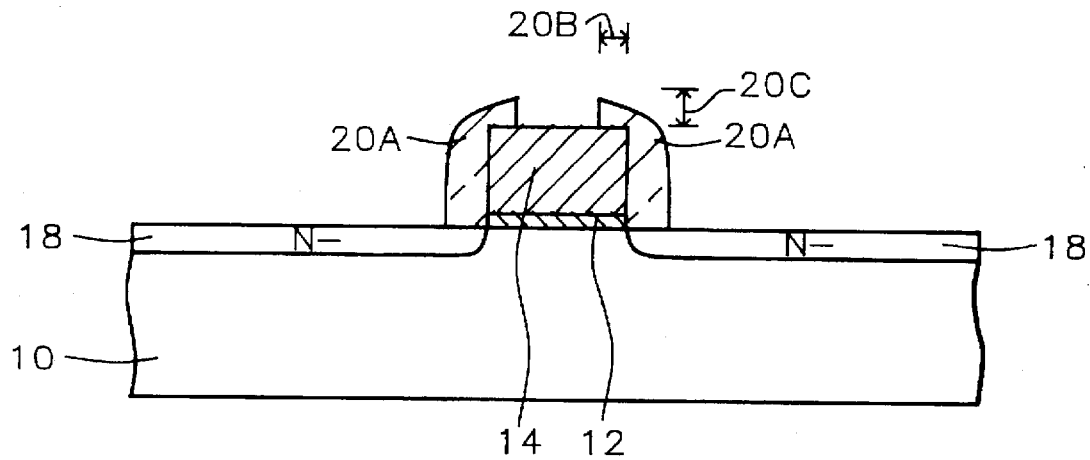

As shown in FIG. 7, the gate cap insulating layer 16A is removed exposing inner portions of the top of the gate 14. The gate cap insulating layer 16A is preferably removed by etching, using $CF_4-H_2$, or $C_2F_6$, $C_2F_6-C_2H_4$, $C_3F_8$, $C_4F_8$, $CHF_3$, or diluted HF solutions and more preferably using diluted HF solutions.

Note that by removing the gate cap insulating layer 16A in this step, gate silicide contacts 24 can be formed to the gate 14. A subsequent gate ion implant can be made through the gate silicide contact 24 as explained below.

Figure 8:
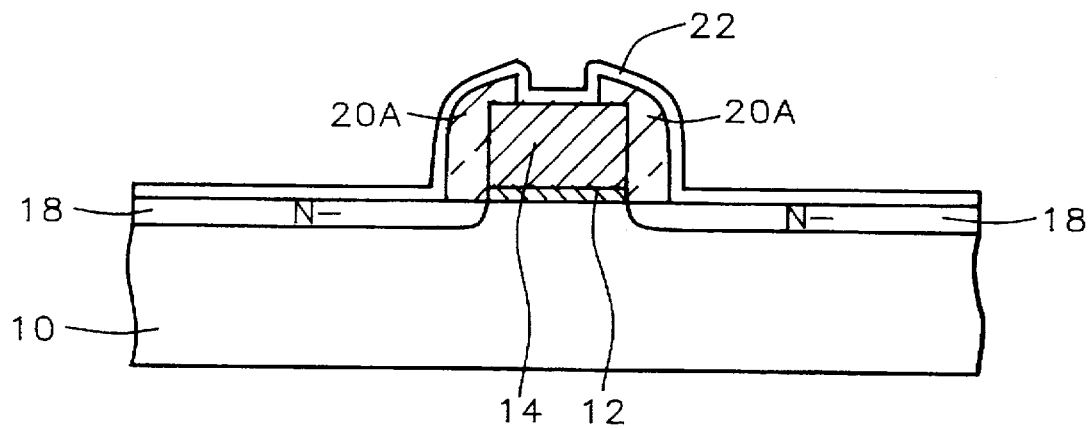

As shown in FIG. 8, a metal layer 22 is deposited over the lightly doped source and drain regions 18, the sidewall spacers 20A, and the gate 14. The metal layer is deposited on the substrate preferably by sputtering. The metal layer is preferably composed of titanium with a thickness in the range of between about 200 and 500 Å, and more preferably about 350 Å.

Figure 9:
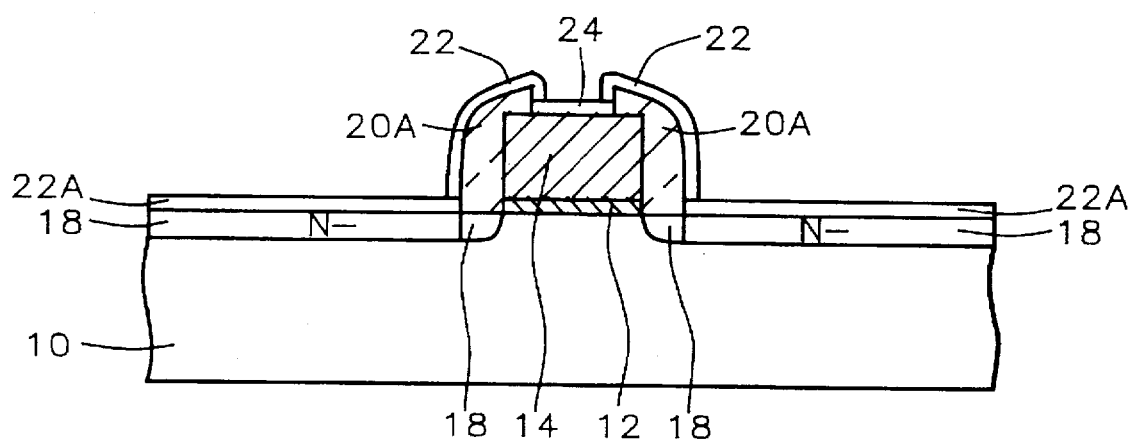

Referring to FIG. 9, the substrate 10 is heated to form a metal silicide layer 22A,24 on the lightly doped source and drain regions 18 and the gate 14. The metal silicide layer 22A is preferably composed of titanium silicide.

The structure is now subjected to a rapid thermal anneal (ETA). Typically the RTA at this stage is performed at a temperature between about 650° and 700° C. for about 30 to 50 seconds. During the RTA the titanium reacts with all silicon surfaces with which the titanium is in contact to form an interface layer of titanium silicide. But the titanium does not react with any oxide or nitride surfaces, such as the sidewall spacers 20A.

The substrate is preferably heated to a temperature in the range of between about 650° and 750° C. This will form a metal silicide layer with a thickness in the range of between about 400 and 1000 Å, and more preferably a titanium silicide layer with a thickness of about 750 Å.

Figure 10:
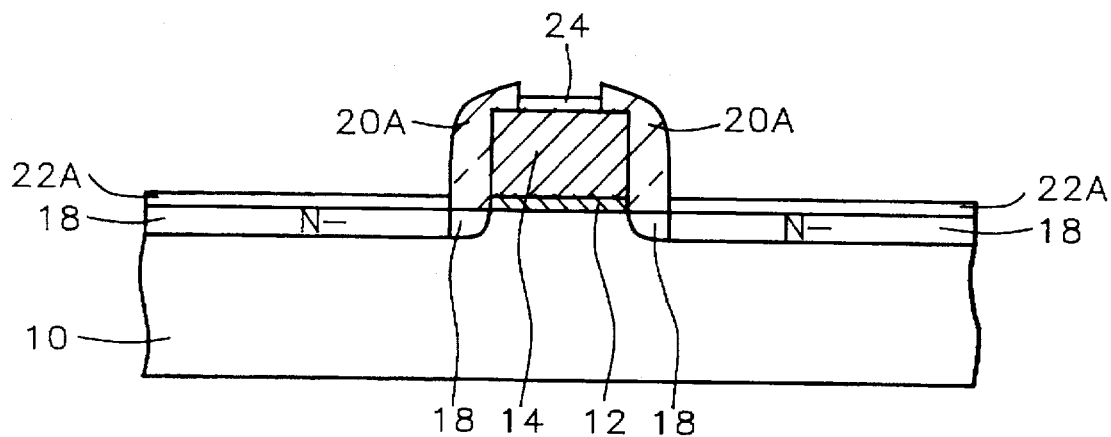

As shown in FIG. 10, the metal layer 22A is selectively removed from the sidewall spacers 20A. The metal layer is preferably removed by etching in an aqueous solution of ammonium hydroxide and hydrogen peroxide to remove any unreacted titanium while leaving the newly formed titanium silicide layer in place.

Figure 11:
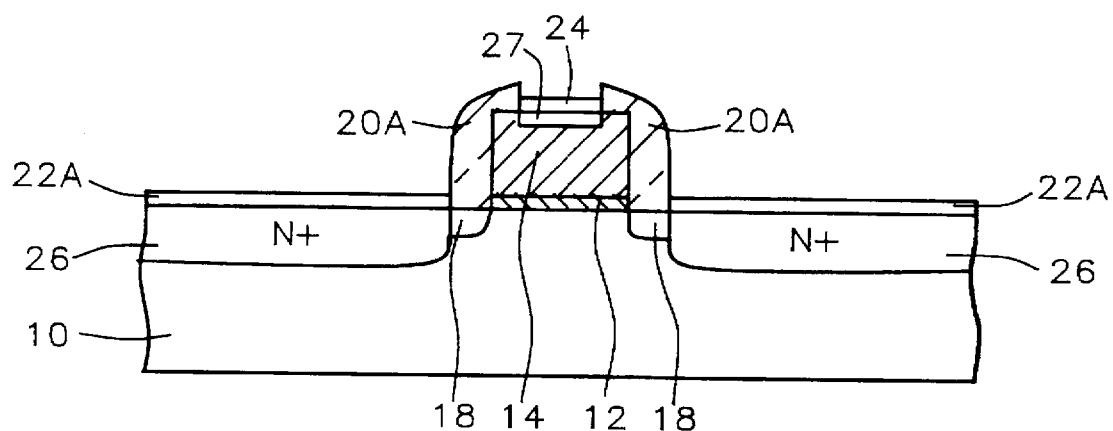

As shown in FIG. 11, impurity ions are implanted into the substrate 10 to form highly doped source and drain regions 26. The implant also dopes the region 27 under the gate contact 24. The impurity ions implanted are preferably N–type impurity ions, such as arsenic, and form doped regions with a concentration in the range of between about $1 \times 10^{20}$ and $1 \times 10^{22}$ atoms/cm$^3$, and more preferably about $1 \times 10^{21}$ atoms/cm$^3$.

The highly doped source and drain regions 26 and the doped gate region 27 are preferably formed by ion implanting arsenic ions into the substrate at an energy in the range of between about 30 and 80 keV and at a dosage in the range of between about 2E15 and 5E16 atoms/cm$^2$.

The present invention can be used for NMOS, PMOS and CMOS devices. For example, the lightly doped source and drain regions 18, and highly doped source and drain regions 26 can also be formed as P-type conductivity regions.

This invention provides many benefits over conventional processes. The extended sidewall spacers 20A which cover portions of the gate, lengthens the leakage current path between the gate contact regions. The longer leakage path decreases leakage currents and improves yields. The high sidewall spacers 20A are an advantage because they will prevent bridging by polysilicon and titanium stringers. The invention forms shallower gate, source and drain (doped) regions because the highly doped gate, source and drain implant is performed after the silicide anneal. The shallower gate, source and drain regions provide faster transistor device circuits.

While the invention has been particularly shown and described with reference to the preferred embodiments thereof, it will be understood by those skilled in the art that various changes in form and details may be made without departing from the spirit and scope of the invention.

What is claimed is:

1. A method of forming a transistor having silicide contacts with shallower gate, source and drain regions in a substrate comprising:

(a) providing a transistor having a gate electrode and spaced lightly doped source and drain regions, said gate electrode having vertical sidewalls, said gate electrode comprising a gate oxide layer, a gate and a gate insulating layer;

(b) removing an outer portion of said gate insulating layer forming a gate cap insulating layer covering a portion of said gate;

(c) forming a dielectric layer over said lightly doped source and drain regions and said gate electrode;

(d) anisotropically etching said dielectric layer forming sidewall spacers;

(e) removing said gate cap insulating layer exposing at least a portion of the top of said gate;

(f) depositing a metal layer over said lightly doped source and drain regions, said sidewall spacers, and said gate;

(g) heating said substrate forming a metal silicide layer on said lightly doped source and drain regions and said gate;

(h) removing said metal layer from said sidewall spacers; and (i) implanting impurity ions into said substrate forming highly doped source and drain regions and forming a doped gate region.

2. The method of claim 1 wherein said gate is composed of polysilicon.

3. The method of claim 1 wherein said gate insulating layer is composed of silicon oxide.

4. The method of claim 1 wherein said sidewall spacers are composed of silicon nitride.

5. The method of claim 1 wherein said sidewall spacers have a height over said gate in the range of between about 0.1 and 0.2 µm and said sidewall spacers cover an outer width of said gate in a range of between about 0.05 and 0.1 µm, and said sidewall spacers have a width in a range of between about 1000 and 2500 Å.

6. The method of claim 1 wherein the removing of said gate cap insulating layer is performed by etching said gate cap insulating layer using a diluted HF solution.

7. The method of claim 1 wherein said metal layer is composed of titanium.

8. The method of claim 1 wherein the heating of said substrate comprises heating said substrate to a temperature in a range of between about 650° and 750° C.

9. The method of claim 1 wherein said metal silicide layer is composed of titanium silicide and said metal silicide layer has a thickness in the range of between about 400 and 1000 Å.

10. The method of claim 1 wherein said highly doped source and drain regions and said doped gate region is formed by ion implanting arsenic ions into said substrate at an energy in the range of between about 30 and 80 keV and a dosage in the range of between about $2 \times 10^{15}$ and $5 \times 10^{16}$ atoms/cm$^2$.

11. The method of claim 1 wherein said lightly doped source and drain regions, highly doped source and drain regions are p-type conductivity regions.

12. A method of forming a transistor having silicide contacts with shallower gate, source and drain regions in a substrate comprising:

(a) providing a transistor having a gate electrode and spaced lightly doped source and drain regions, said gate electrode having vertical sidewalls, said gate electrode comprising a gate oxide layer, a gate and a gate insulating layer, said gate insulating layer is composed of silicon oxide;

(b) forming a photoresist block over a central portion of said gate insulating layer;

(c) etching said gate insulting layer using said photoresist block as a mask forming a gate cap insulting layer covering a portion of said gate;

(d) forming a dielectric layer composed of silicon nitride over said lightly doped source and drain regions and said gate electrode;

(e) anisotropically etching said dielectric layer forming sidewall spacers;

(f) removing portions of said gate cap insulating layer exposing at least a portion of the top of said gate;

(g) depositing a metal layer composed of titanium over said lightly doped source and drain regions, said sidewall spacers, and said gate;

(h) heating said substrate forming a metal silicide layer on said lightly doped source and drain regions and said gate;

(i) removing said metal layer from said sidewall spacers; and (j) implanting impurity ions into said substrate forming highly doped source and drain regions and forming a doped gate region.

13. The method of claim 12 wherein said photoresist block is formed by forming a photoresist layer over said gate cap insulating layer, and laterally etching said photoresist layer with an oxygen plasma.

14. The method of claim 12 wherein said gate is composed of polysilicon.

15. The method of claim 12 wherein said sidewall spacers have a height over said gate in the range of between about 0.1 and 0.2 µm and said sidewall spacers cover an outer width of said gate in a range of between about 0.05 and 0.1 µm, and said sidewall spacers have a width at the base of said gate in a range of between about 1000 and 2500 Å.

16. The method of claim 12 wherein the removing of said gate cap insulating layer is performed by etching said gate cap insulating layer using a diluted HF solution.

17. The method of claim 12 wherein the heating of said substrate comprises heating said substrate to a temperature in a range of between about 650° and 750° C.

18. The method of claim 12 wherein said metal silicide layer is composed of titanium silicide and said metal silicide layer has a thickness in a range of between about 400 and 1000 Å.

19. The method of claim 12 wherein said highly doped source and drain regions and said doped gate region are formed by ion implanting arsenic ions into said substrate at an energy in a range of between about 30 and 80 keV and a dosage in a range of between about $2 \times 10^{15}$ and $5 \times 10^{16}$ atoms/cm$^2$.

20. The method of claim 12 wherein said lightly doped source and drain regions, highly doped source and drain regions are p-type conductivity regions.

* * * * *